United States Patent
Zhao

(10) Patent No.: US 10,580,898 B2
(45) Date of Patent: Mar. 3, 2020

(54) SEMICONDUCTOR DEVICE AND METHOD FOR MANUFACTURING SAME

(71) Applicants: Semiconductor Manufacturing International (Beijing) Corporation, Beijing (CN); Semiconductor Manufacturing International (Shanghai) Corporation, Shanghai (CN)

(72) Inventor: Meng Zhao, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/106,654

(22) Filed: Aug. 21, 2018

(65) Prior Publication Data
US 2019/0181266 A1  Jun. 13, 2019

(30) Foreign Application Priority Data
Dec. 12, 2017  (CN) .......................... 2017 1 1317558

(51) Int. Cl.
*H01L 29/78*  (2006.01)
*H01L 29/417*  (2006.01)
(Continued)

(52) U.S. Cl.
CPC .. *H01L 29/7853* (2013.01); *H01L 21/823821* (2013.01); *H01L 21/845* (2013.01);
(Continued)

(58) Field of Classification Search
CPC combination set(s) only.
See application file for complete search history.

(56) References Cited

U.S. PATENT DOCUMENTS 9,391,204 B1 * 7/2016 Cheng .................... H01L 29/785
2015/0041897 A1 * 2/2015 Basker ................ H01L 29/7848
257/347

(Continued)

*Primary Examiner* — Mamadou L Diallo
(74) *Attorney, Agent, or Firm* — Brinks Gilson & Lione

(57) ABSTRACT

The present disclosure provides semiconductor devices and methods for manufacturing same and relates to the field of semiconductor technologies. Some implementations of a method may include: providing a semiconductor structure, where the semiconductor structure includes a substrate, a semiconductor fin having a first conductivity type and disposed on the substrate, and a gate structure covering a part of the semiconductor fin, where the semiconductor fin includes a first part and a second part respectively located on two sides of the gate structure; executing first doping on the first part and the second part of the semiconductor fin, where a dopant from the first doping has a second conductivity type that is opposite to the first conductivity type; and after the first doping is executed, forming a source on the first part of the semiconductor fin and forming a drain on the second part of the semiconductor fin. The present disclosure can reduce a series resistance between a channel region in the semiconductor fin and the source and the drain, thereby improving device performance.

16 Claims, 12 Drawing Sheets

(51) Int. Cl.
*H01L 21/84* (2006.01)
*H01L 21/8238* (2006.01)
*H01L 29/66* (2006.01)

(52) U.S. Cl.
CPC .. *H01L 29/41791* (2013.01); *H01L 29/66803* (2013.01); *H01L 29/66818* (2013.01); *H01L 29/7851* (2013.01)

(56) References Cited

U.S. PATENT DOCUMENTS

| | | | | |
|---|---|---|---|---|
| 2015/0200291 A1* | 7/2015 | Alptekin | ............... | H01L 29/785 257/401 |
| 2018/0006162 A1* | 1/2018 | Zhou | ................ | H01L 21/76895 |
| 2018/0040604 A1* | 2/2018 | Zhou | ................ | H01L 21/26513 |

* cited by examiner

SEMICONDUCTOR DEVICE AND METHOD FOR MANUFACTURING SAME

RELATED APPLICATIONS

The present application claims priority to Chinese Patent Appln. No. 201711317558.2, filed on Dec. 12, 2017, the entire disclosure of which is hereby incorporated by reference.

BACKGROUND

Technical Field

The present disclosure relates to the field of semiconductor technologies and in particular, to a semiconductor device and a method for manufacturing same.

Related Art

Currently, with gradual reduction in the size of semiconductor devices, a short channel effect (SCE for short) becomes increasingly serious. To improve the SCE of a core device, currently, research has provided a semiconductor device having an ultra-shallow junction or an abrupt junction.

To enhance device performance, a direction of a next-generation technology is to use a fin field effect transistor (FinFET) device, where the FinFET device can ease the SCE. However, to satisfy requirements of the FinFET device, the device performance and control of the SCE need to be balanced. It has become an increasingly challenging problem for technicians to address the problem. For example, shapes of a lightly doped drain (LDD) and a halo doping region may be optimized using a co-implant process of non-crystallizing ion implantation or the stress effect, so as to improve device performance.

However, in existing FinFET devices, problems in that a series resistance between a channel region and a source and a drain is relatively large and in that a leakage current is also relatively large also exist.

SUMMARY

A technical problem addressed by embodiments and implementations of the present disclosure is: to provide a method for manufacturing a semiconductor device, and to reduce a series resistance between a channel region and a source and a drain.

In one aspect of the present disclosure, a method for manufacturing a semiconductor device is provided. The method may include: providing a semiconductor structure, where the semiconductor structure includes a substrate, a semiconductor fin having a first conductivity type and disposed on the substrate, and a gate structure covering a part of the semiconductor fin, wherein the semiconductor fin includes a first part and a second part respectively located on two sides of the gate structure; executing first doping on the first part and the second part of the semiconductor fin, where a dopant from the first doping has a second conductivity type that is opposite to the first conductivity type; and after the first doping is executed, forming a source on the first part of the semiconductor fin and forming a drain on the second part of the semiconductor fin.

In some implementations, when the first conductivity type is a P type, the second conductivity type is an N type, and the dopant from the first doping includes arsenic, phosphorus, or nitrogen; and when the first conductivity type is an N type, the second conductivity type is a P type, and the dopant from the first doping includes boron, boron difluoride, or indium.

In some implementations, in a process of executing the first doping, the dopant from the first doping further includes carbon.

In some implementations, the method further includes, before the first doping is executed: depositing a pad layer on the semiconductor structure, where the pad layer covers at least the gate structure and the first part and the second part of the semiconductor fin; and executing etching on the pad layer to remove a part, located on the first part and the second part, of the pad layer and reserve a part, separately located on side surfaces on two sides of the gate structure, of the pad layer, where after the source and the drain are formed, the reserved part of the pad layer separately separates the source and the drain from the gate structure.

In some implementations, in the step of providing a semiconductor structure, the semiconductor structure further includes a trench disposed on the substrate and around the semiconductor fin and a trench insulator layer partially filling the trench; and the method further includes, before the source and the drain are formed: depositing a cover layer on the semiconductor structure on which the first doping has been executed; executing planarization on the cover layer; and after the planarization is executed, etching the cover layer to remove a part of the cover layer, separately located on two sides of the first part of the semiconductor fin and two sides of the second part of the semiconductor fin, so as to expose a part of the first part of the semiconductor fin and a part of the second part of the semiconductor fin, where a remaining part of the cover layer, located on two sides of the first part of the semiconductor fin and two sides of the second part of the semiconductor fin, is higher than the trench insulator layer.

In some implementations, a material of the cover layer includes silicon oxide; and a material of the pad layer includes silicon nitride or silicon oxide having a compactness greater than that of the cover layer.

In some implementations, the method further includes: before the source and the drain are formed: executing second doping on the exposed part of the first part of the semiconductor fin and the exposed part of the second part of the semiconductor fin, where a dopant from the second doping has the second conductivity type opposite to the first conductivity type.

In some implementations, when the first conductivity type is a P type, the second conductivity type is an N type, and the dopant from the second doping includes arsenic, phosphorus, or nitrogen; and when the first conductivity type is an N type, the second conductivity type is a P type, and the dopant from the second doping includes boron, boron difluoride, or indium.

In some implementations, in a process of executing the second doping, the dopant from the second doping further includes carbon.

In some implementations, the first doping and the second doping are both ion implantation processes.

In some implementations, the method further includes: after the second doping is executed and before the source and the drain are formed, executing annealing processing.

In some implementations, the method further includes, before or after the second doping is executed: executing pocket doping on the first part of the semiconductor fin and the second part of the semiconductor fin, where a conductivity type of a dopant from the pocket doping is the first conductivity type; and when the first conductivity type is a P type, the dopant from the pocket doping includes boron or boron difluoride, and when the first conductivity type is an N type, the dopant from the pocket doping includes phosphorus or arsenic.

In some implementations, the pocket doping uses an in-situ doping process or an ion implantation process.

In some implementations, the step of forming a source and a drain includes: etching the first part and the second part of the semiconductor fin to respectively form a first depression and a second depression; and respectively epitaxially growing the source and the drain in the first depression and the second depression.

In another aspect of the present disclosure, a semiconductor device is provided. The semiconductor device may include: a substrate; a semiconductor fin having a first conductivity type and disposed on the substrate; a gate structure covering a part of the semiconductor fin, where the semiconductor fin includes a first part and a second part respectively located on two sides of the gate structure, where the first part of the semiconductor fin and the second part of the semiconductor fin are doped with dopants, the dopants have a second conductivity type opposite to the first conductivity type; and a source disposed on the first part of the semiconductor fin and a drain disposed on the second part of the semiconductor fin.

In some implementations, when the first conductivity type is a P type, the second conductivity type is an N type, and the dopants include arsenic, phosphorus, or nitrogen; and when the first conductivity type is an N type, the second conductivity type is a P type, and the dopants include boron, boron difluoride, or indium.

In some implementations, the dopants further include carbon.

In some implementations, the semiconductor device further includes: a pad layer separately disposed on side surfaces on two sides of the gate structure, where the pad layer separately separates the source and the drain from the gate structure.

In some implementations, the semiconductor device further includes: a trench disposed on the substrate and around the semiconductor fin; a trench insulator layer partially filling the trench; and a cover layer disposed on the trench insulator layer and located on two sides of the first part of the semiconductor fin and two sides of the second part of the semiconductor fin.

In some implementations, a material of the cover layer includes silicon oxide; and a material of the pad layer includes silicon nitride or silicon oxide having a compactness greater than that of the cover layer.

In forms of the foregoing manufacturing method, the first doping is executed on the first part and the second part of the semiconductor fin, located on two sides of the gate structure, where the conductivity type of the dopant from the first doping is opposite to the conductivity type of the semiconductor fin, and then the source and the drain are respectively formed on the first part and the second part of the semiconductor fin. The first doping may reduce a series resistance between the channel region in the semiconductor fin and the source and the drain, separately, thereby improving device performance.

Further, implementations of the foregoing manufacturing method can improve the SCE of the semiconductor device and can reduce a leakage current, thereby improving device performance.

Exemplary embodiments and implementations of the present disclosure are described in detail below with reference to the accompanying drawings, and other features and of the present disclosure and advantages thereof will become clear.

BRIEF DESCRIPTION OF THE DRAWINGS

Accompanying drawings constituting a part of the specification describe the embodiments and implementations of the present disclosure and are used for explaining the principles of the present disclosure together with the specification.

With reference to the accompanying drawings, according to detailed descriptions below, the present disclosure may be more clearly understood, where.

DETAILED DESCRIPTION

The exemplary embodiments and implementations of the present disclosure are described in detail with reference to the accompanying drawings. It should be noted that unless otherwise specifically described, relative arrangements, numerical expressions, and values of parts and steps stated in these embodiments and implementations do not limit the scope of the present disclosure.

In addition, it should be understood that for ease of description, sizes of parts shown in the accompanying drawings are not drawn according to actual proportional relationships.

The following descriptions for at least one exemplary embodiment are actually merely illustrative and do not compose any limitation to the present disclosure or application or use thereof.

Technologies, methods, and devices that are known to a person of ordinary skill in the art may not be discussed in detail, but in proper cases, the technologies, methods, and devices should be regarded as a part of the specification.

In all examples that are shown and discussed herein, any specific value should be explained to be merely exemplary and does not compose a limitation. Therefore, other examples of exemplary embodiments or implementations may have different values.

It should be noted that similar marks and letters represent similar items in the following accompanying drawings. Therefore, once an item is defined in an accompanying drawing, the item does not need to be further discussed in subsequent accompanying drawings.

Figure 1:
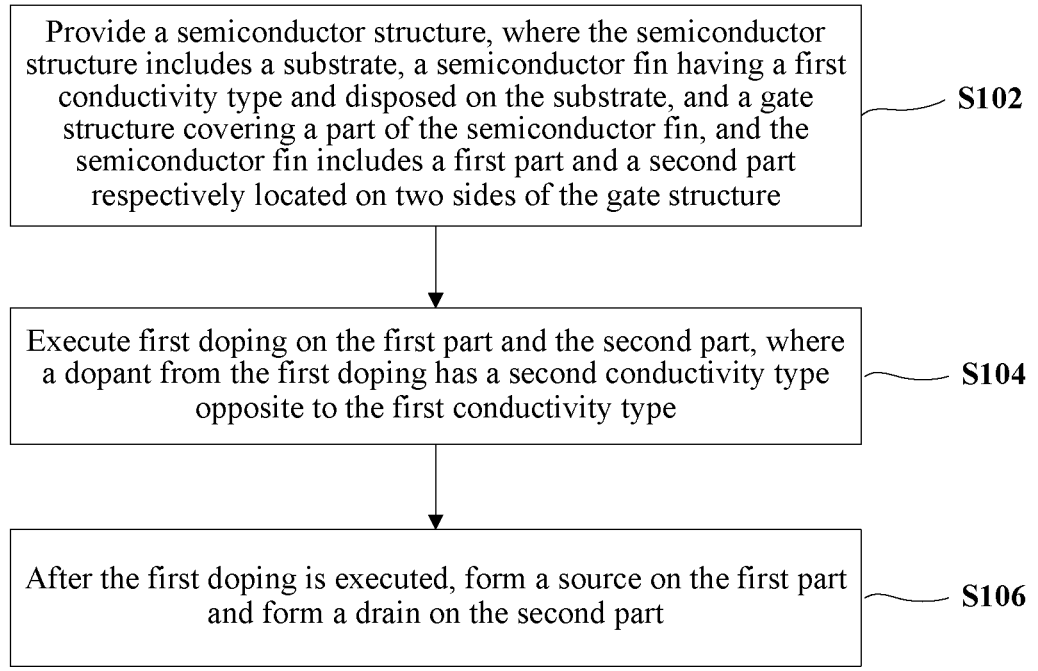
FIG. 1 is a flowchart of a method for manufacturing a semiconductor device according to some implementations of the present disclosure.

FIG. 1 is a flowchart of a method for manufacturing a semiconductor device according to some implementations of the present disclosure.

Step S102: Provide a semiconductor structure, where the semiconductor structure includes a substrate, a semiconductor fin having a first conductivity type and disposed on the substrate, and a gate structure covering a part of the semiconductor fin, and the semiconductor fin includes a first part and a second part respectively located on two sides of the gate structure.

The first conductivity type may be a P type or an N type. For the semiconductor structure including the P-semiconductor fin, in subsequent steps, an N-channel metal oxide semiconductor (NMOS) transistor device is formed. For the semiconductor structure including the N-semiconductor fin, in subsequent steps, a P-channel metal oxide semiconductor (PMOS) transistor device is formed.

Step S104: Execute first doping on the first part and the second part, where a dopant from the first doping has a second conductivity type opposite to the first conductivity type.

In some implementations, when the first conductivity type is a P type, the second conductivity type is an N type, and the dopant from the first doping may include arsenic, phosphorus, nitrogen, or the like.

In some other implementations, when the first conductivity type is an N type, the second conductivity type is a P type, and the dopant from the first doping may include boron, boron difluoride, indium, or the like.

Step S106: After the first doping is executed, form a source on the first part and form a drain on the second part.

In some implementations, the step of forming a source and a drain may include: epitaxially growing the source directly on the first part and epitaxially growing the drain directly on the second part.

In some other implementations, the step of forming a source and a drain may include: etching the first part and the second part to respectively form a first depression and a second depression; and respectively epitaxially growing the source and the drain in the first depression and the second depression.

In forms of the foregoing manufacturing method, the first doping is executed on the first part and the second part of the semiconductor fin, located on two sides of the gate structure, where the conductivity type of the dopant from the first doping is opposite to the conductivity type of the semiconductor fin. Then, the source and the drain are respectively formed on the first part and the second part. The first doping is equivalent to increasing a contact area of the source and the drain, separately, and a channel region (which may be located between the first part and the second part of the semiconductor fin and below the gate structure) of the semiconductor fin. Therefore, a series resistance between the channel region and the source and the drain can be reduced, thereby improving device performance.

FIG. 2A to FIG. 2C, FIG. 3A to FIG. 3C, FIG. 4A to FIG. 4C, FIG. 5, FIG. 6A to FIG. 6C, FIG. 7A to FIG. 7C, FIG. 8, FIG. 9A to FIG. 9B, and FIG. 10A to FIG. 10B are schematic sectional views of structures at several stages in a process of manufacturing a semiconductor device according to some implementations of the present disclosure. A process of manufacturing a semiconductor device according to some implementations of the present disclosure is described in detail below with reference to these figures.

Figure 2A:
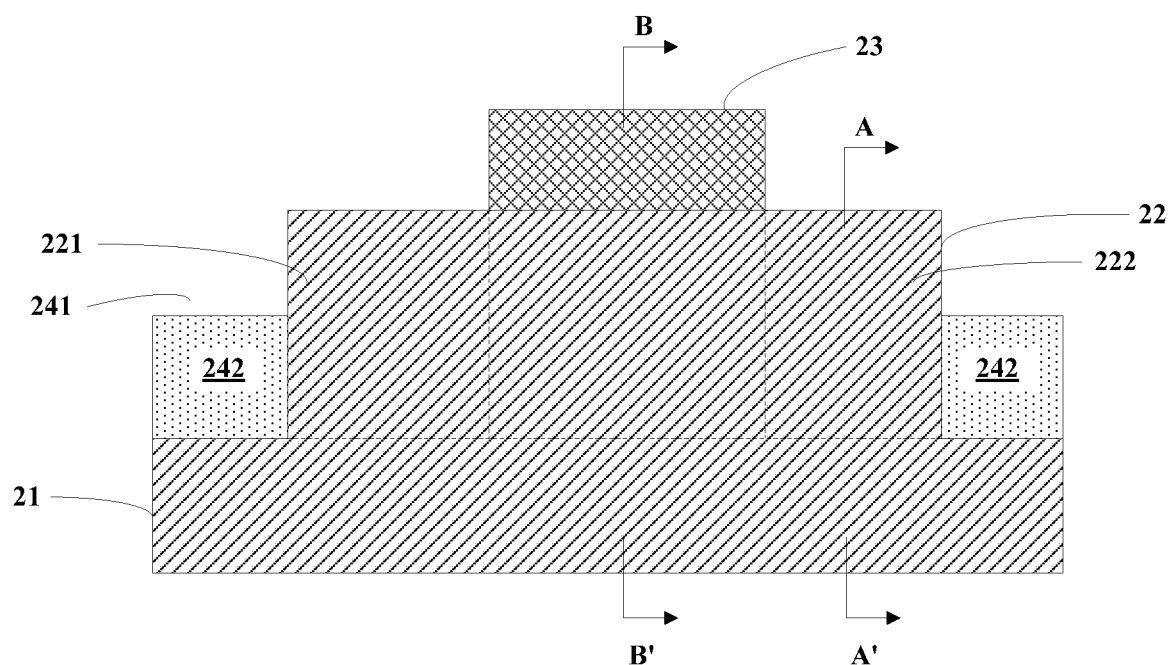
FIG. 2A is a schematic sectional view of a structure at one stage in a process of manufacturing a semiconductor device according to some implementations of the present disclosure.
Figure 2B:
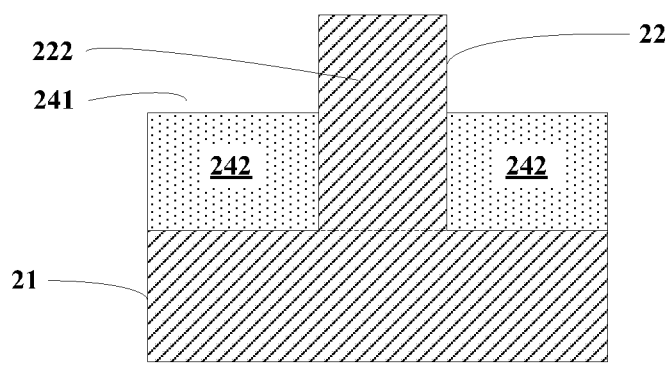
FIG. 2B is a schematic sectional view of a structure captured along a line A-A' in FIG. 2A.
Figure 2C:
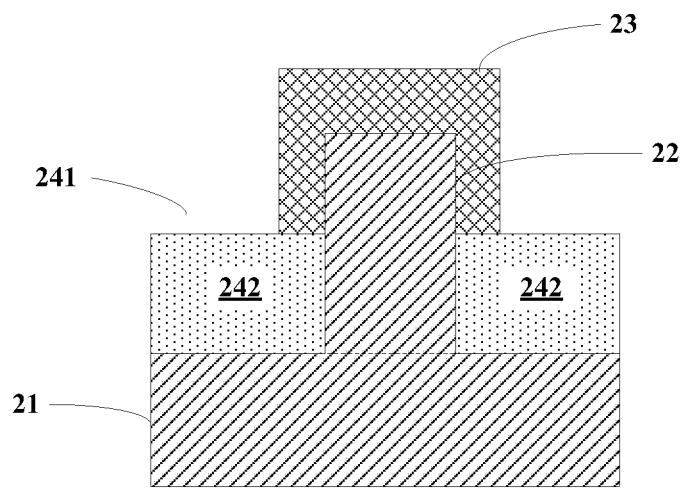
FIG. 2C is a schematic sectional view of a structure captured along a line B-B' in FIG. 2A.

First, as shown in FIG. 2A to FIG. 2C, a semiconductor structure is provided, and the semiconductor structure may include: a substrate 21, a semiconductor fin 22 having a first conductivity type and disposed on the substrate 21, and a gate structure 23 covering a part of the semiconductor fin 22. The semiconductor fin 22 includes a first part 221 and a second part 222 respectively located on two sides of the gate structure 23. For example, the substrate 21 may be a silicon substrate. For example, the substrate 21 may be a silicon substrate with a crystal orientation of <110> or <100> or other crystal orientations. For example, a height range of the semiconductor fin may be from 30 nm to 70 nm.

It should be noted that dotted lines shown in FIG. 2A are used for conveniently showing and describing related structures, and the dotted lines do not necessarily exist in actual structures. The following accompanying drawings have similar cases.

In some implementations, the gate structure may include: a gate insulator layer (not shown in the figure) covering on the semiconductor fin, a gate (not shown in the figure)

disposed on the gate insulator layer, and a spacer layer (not shown in the figure) located on side surfaces on two sides of the gate. For example, a material of the gate insulator layer may include a high dielectric constant material, silicon oxide, or the like. A material of the gate may include polysilicon, a metal such as tungsten, or the like. A material of the spacer layer may include silicon oxide and/or silicon nitride, or the like.

In some implementations, after the semiconductor device is subsequently formed, a part, between the first part 221 and the second part 222, in the semiconductor fin may be used as a channel region.

In some implementations, in the step of providing a semiconductor structure, as shown in FIG. 2A to FIG. 2C, the semiconductor structure may further include a trench 241 disposed on the substrate 21 and around the semiconductor fin 22 and a trench insulator layer 242 partially filling the trench 241. For example, a material of the trench insulator layer 242 may include silicon oxide.

In some implementations of the present disclosure, the semiconductor structure shown in FIG. 2A may further include an LDD area (not shown in the figure). During formation of the semiconductor structure shown in FIG. 2A, a threshold voltage ion implantation operation may also be executed, to adjust a threshold voltage. The LDD and the threshold voltage ion implantation may use an existing technology, and this is not described in detail herein.

Figure 3A:
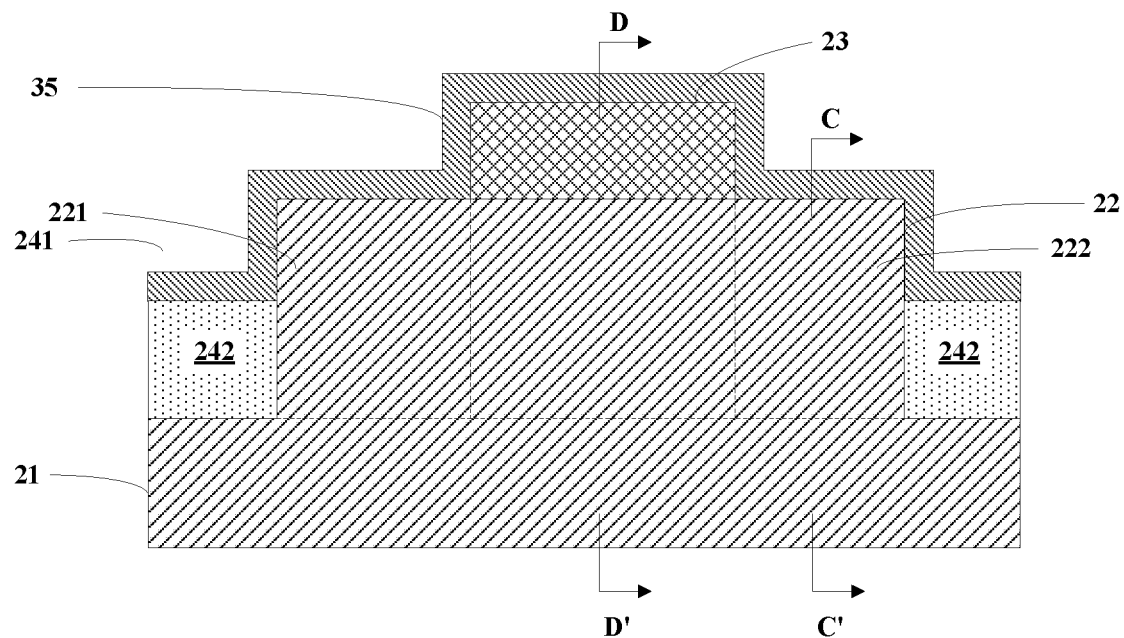
FIG. 3A is a schematic sectional view of a structure at one stage in a process of manufacturing a semiconductor device according to some implementations of the present disclosure.
Figure 3B:
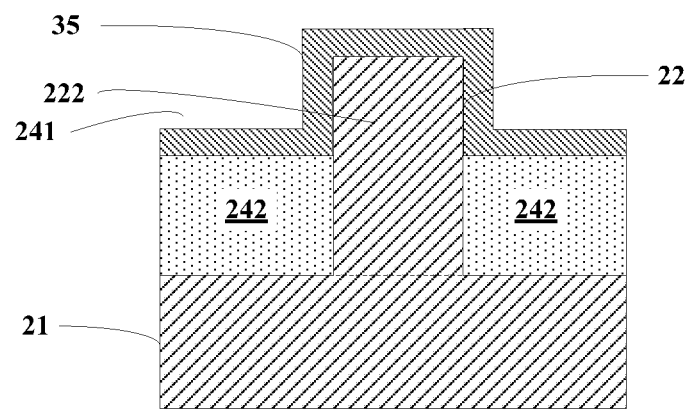
FIG. 3B is a schematic sectional view of a structure captured along a line C-C' in FIG. 3A.
Figure 3C:
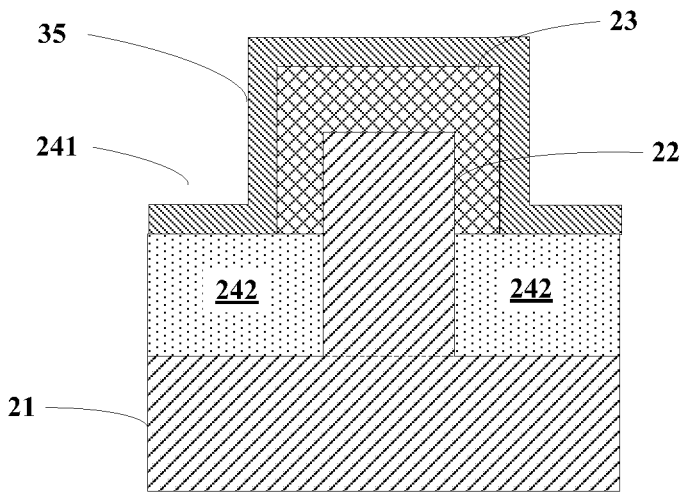
FIG. 3C is a schematic sectional view of a structure captured along a line D-D' in FIG. 3A.

Then, optionally, as shown in FIG. 3A to FIG. 3C, a pad layer 35 is deposited on the semiconductor structure shown in FIG. 2A. The pad layer 35 covers at least the gate structure 23 (including covering the top and side surfaces on two sides of the gate structure) and the first part 221 and the second part 222 of the semiconductor fin 22. The pad layer may also cover the trench insulator layer 242. For example, a material of the pad layer 35 may include silicon nitride, silicon oxide, or the like.

Figure 4A:
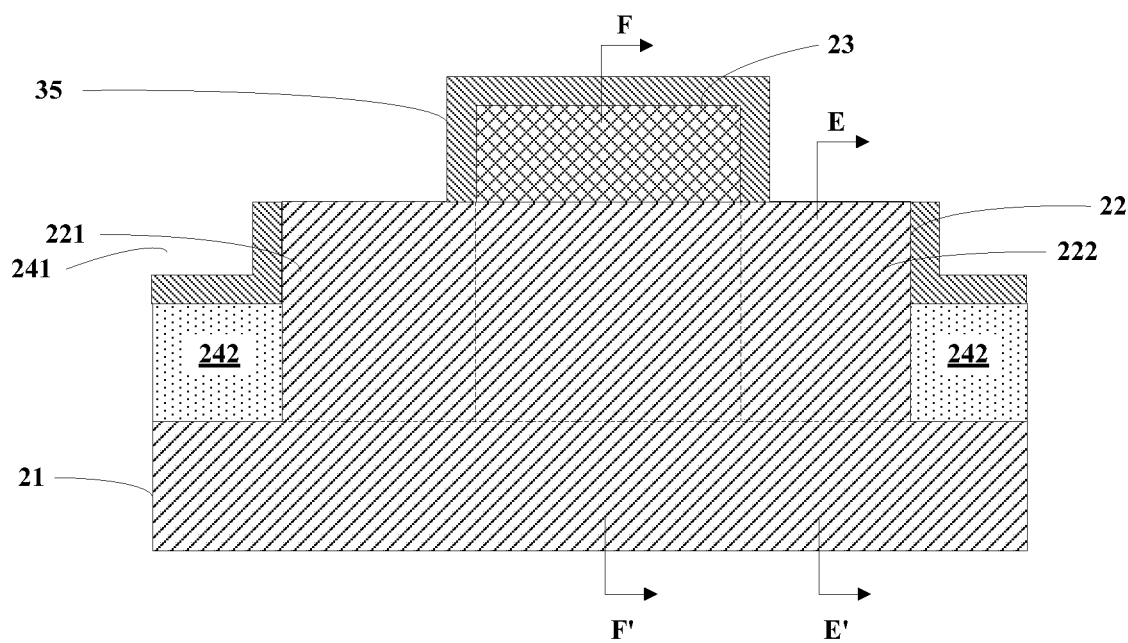
FIG. 4A is a schematic sectional view of a structure at one stage in a process of manufacturing a semiconductor device according to some implementations of the present disclosure.
Figure 4B:
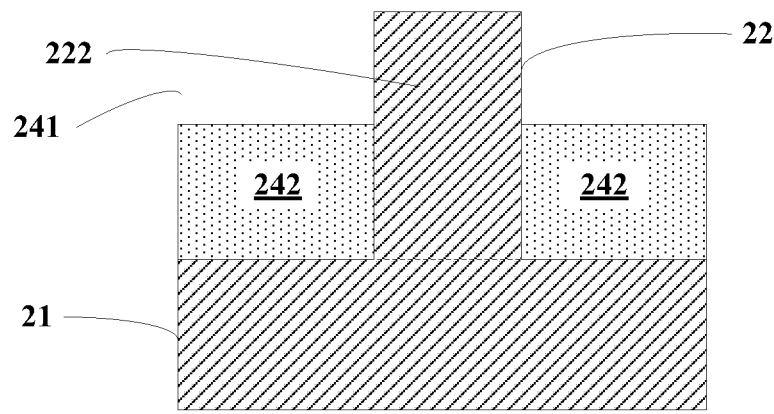
FIG. 4B is a schematic sectional view of a structure captured along a line E-E' in FIG. 4A.
Figure 4C:
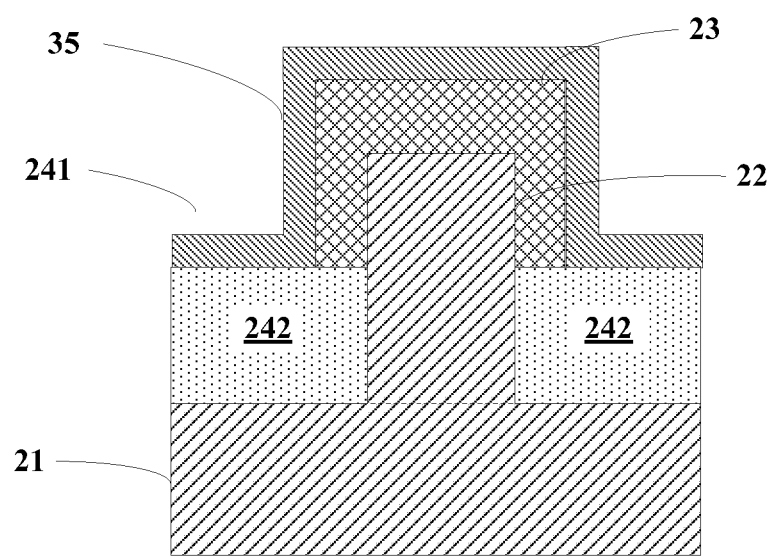
FIG. 4C is a schematic sectional view of a structure captured along a line F-F' in FIG. 4A.

Then, optionally, as shown in FIG. 4A to FIG. 4C, etching (for example, dry etching) is executed on the pad layer 35, to remove a part, located on the first part 221 and the second part 222, of the pad layer 35 and reserve a part, separately located on side surfaces on two sides of the gate structure 23, of the pad layer 35. After the source and the drain are subsequently formed, the reserved part (for example, the part, reserved on side surfaces on two sides of the gate structure 23, of the pad layer 35) of the pad layer 35 separately separates the source and the drain from the gate structure.

As shown in FIG. 4A, after the foregoing steps of depositing and etching the pad layer, the part of the pad layer 35 is formed on side surfaces on two sides of the gate structure 23, so that a dopant from first doping is prevented from entering the channel region to a largest extent in a subsequent process of implementing the first doping, so that doping impact that the dopant entering the channel region may have on the channel region is avoided.

It should be noted that the foregoing steps of depositing and etching the pad layer are optional implementations. The method in some implementations of the present disclosure may not include the foregoing steps of depositing and etching the pad layer but include directly performing the subsequent first doping step.

Figure 5:
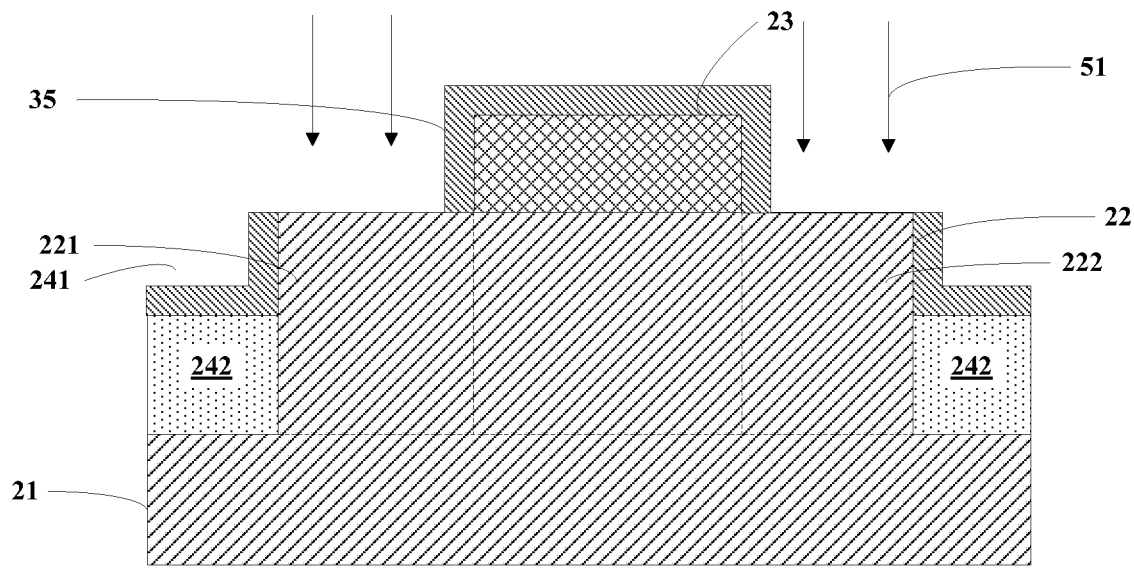
FIG. 5 is a schematic sectional view of a structure at one stage in a process of manufacturing a semiconductor device according to some implementations of the present disclosure.

Then, as shown in FIG. 5, first doping 51 is executed on the first part 221 and the second part 222, where a dopant from the first doping 51 has a second conductivity type opposite to the first conductivity type. For example, the first doping may be an ion implantation process. In this step, the gate structure and the part, located on side surfaces on two sides of the gate structure, of the pad layer may be used as a mask, and the dopant is implanted into the first part and the second part of the semiconductor fin in a self-aligned manner.

In some implementations, when the first conductivity type is a P type, the second conductivity type is an N type, and the dopant from the first doping may include arsenic, phosphorus, nitrogen, or the like. For example, the ion implantation process may be used as the first doping, so as to implant arsenic, phosphorus, nitrogen, or the like. Process conditions of the ion implantation by means of which these dopants are implanted may include: a range of implantation energy may be from 15 KeV to 40 KeV (for example, the implantation energy may be 20 KeV, 30 KeV, or the like); a range of an implantation dose may be from $3 \times 10^{12}$ cm$^{-2}$ to $3 \times 10^{13}$ cm$^{-2}$ (for example, the implantation dose may be $5 \times 10^{12}$ cm$^{-2}$, $1 \times 10^{13}$ cm$^{-2}$, or the like); a range of an implantation angle may be from 0° to 45° (for example, the implantation angle may be 20°, 30°, 40°, or the like).

In some other implementations, when the first conductivity type is an N type, the second conductivity type is a P type, and the dopant from the first doping may include boron, boron difluoride, indium, or the like. For example, the ion implantation process may be used as the first doping, so as to implant boron, boron difluoride, indium, or the like. Process conditions of the ion implantation by means of which these dopants are implanted may include: a range of implantation energy may be from 5 KeV to 15 KeV (for example, the implantation energy may be 10 KeV); a range of an implantation dose may be from $3 \times 10^{12}$ cm$^{-2}$ to $3 \times 10^{13}$ cm$^{-2}$ (for example, the implantation dose may be $5 \times 10^{12}$ cm$^{-2}$, $1 \times 10^{13}$ cm$^{-2}$, or the like); a range of an implantation angle may be from 0° to 45° (for example, the implantation angle may be 20°, 30°, 40°, or the like).

In some implementations, in a process of executing the first doping, the dopant from the first doping may further include carbon. The carbon can reduce possible diffusion of the dopant (for example, phosphorus, boron, or the like) from the first doping towards the channel region of the semiconductor fin, so as to reduce impact that these dopants may have on the channel region.

Figure 6A:
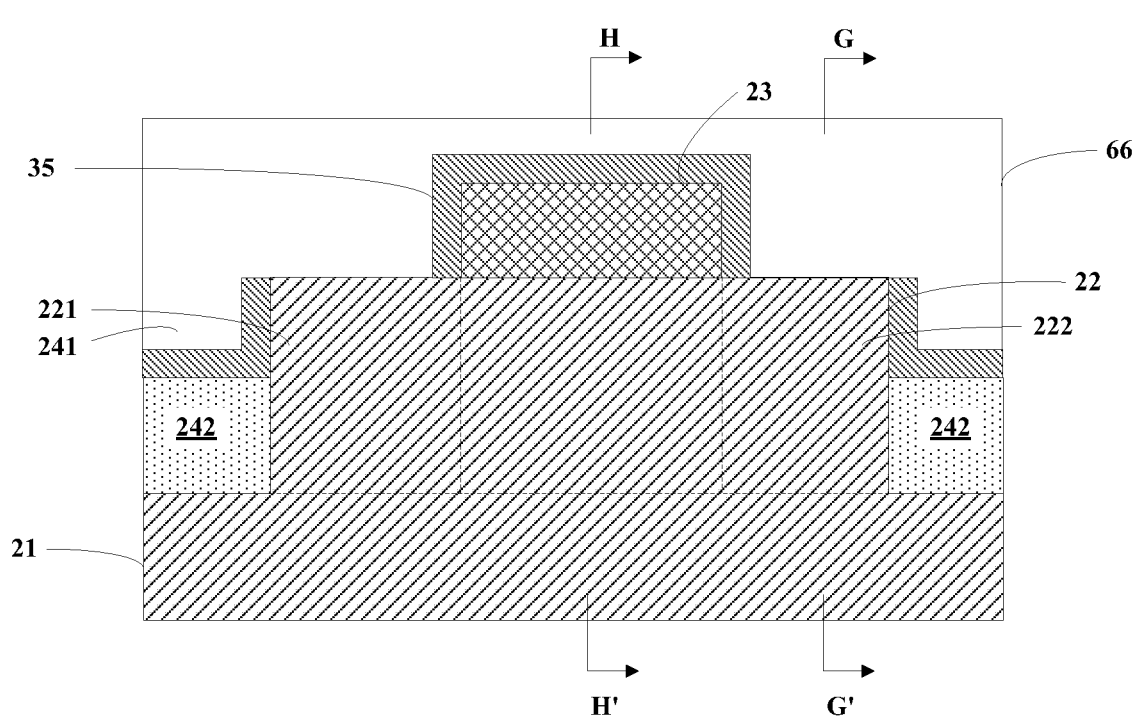
FIG. 6A is a schematic sectional view of a structure at one stage in a process of manufacturing a semiconductor device according to some implementations of the present disclosure.
Figure 6B:
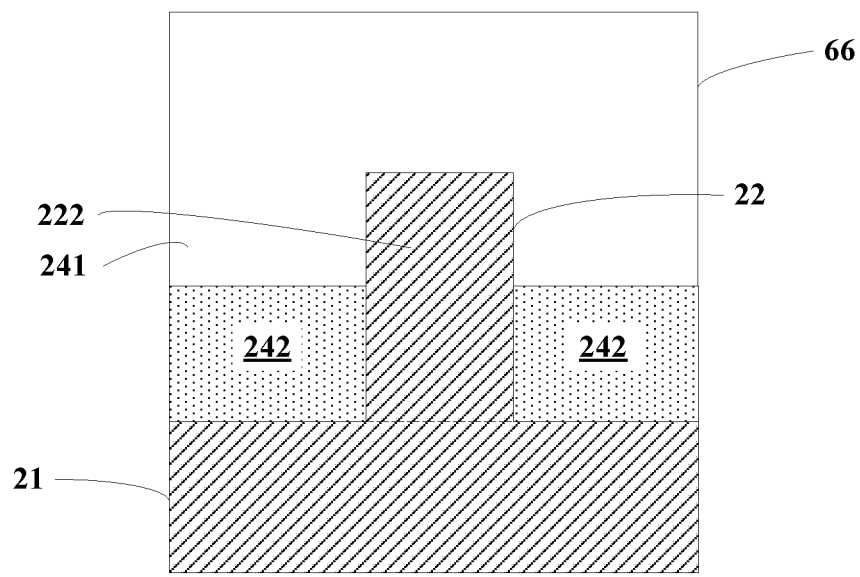
FIG. 6B is a schematic sectional view of a structure captured along a line G-G' in FIG. 6A.
Figure 6C:
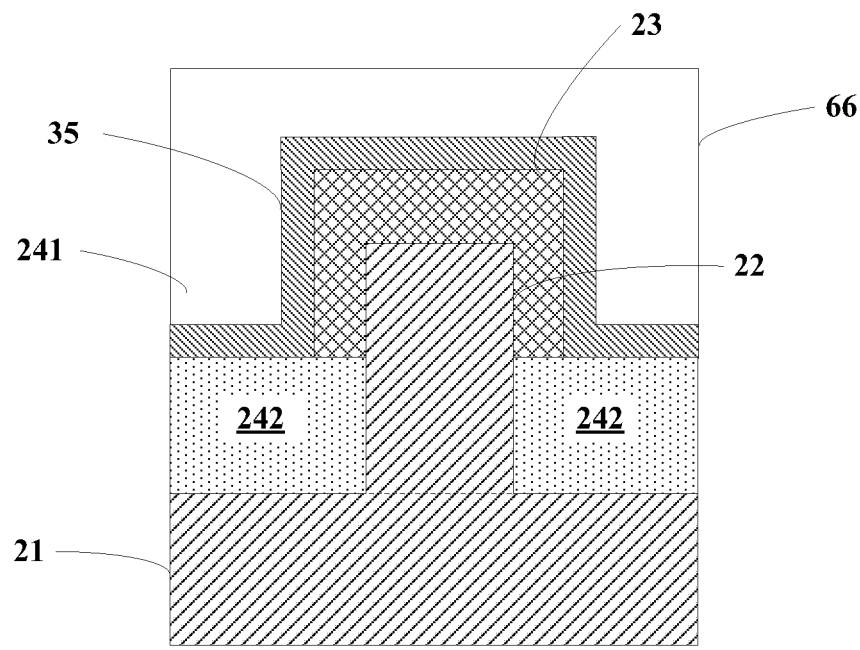
FIG. 6C is a schematic sectional view of a structure captured along a line H-H' in FIG. 6A.

Then, optionally, as shown in FIG. 6A to FIG. 6C, a cover layer 66 is deposited on the semiconductor structure on which the first doping has been executed. The cover layer 66 may cover on surfaces of the first part 221 and the second part 222 and may cover the pad layer 35 disposed on the gate structure 23 and disposed on the trench insulator layer 242. For example, a material of the cover layer may include silicon oxide.

Then, optionally, planarization (for example, chemical mechanical planarization (CMP)) is executed on the cover layer 66.

Figure 7A:
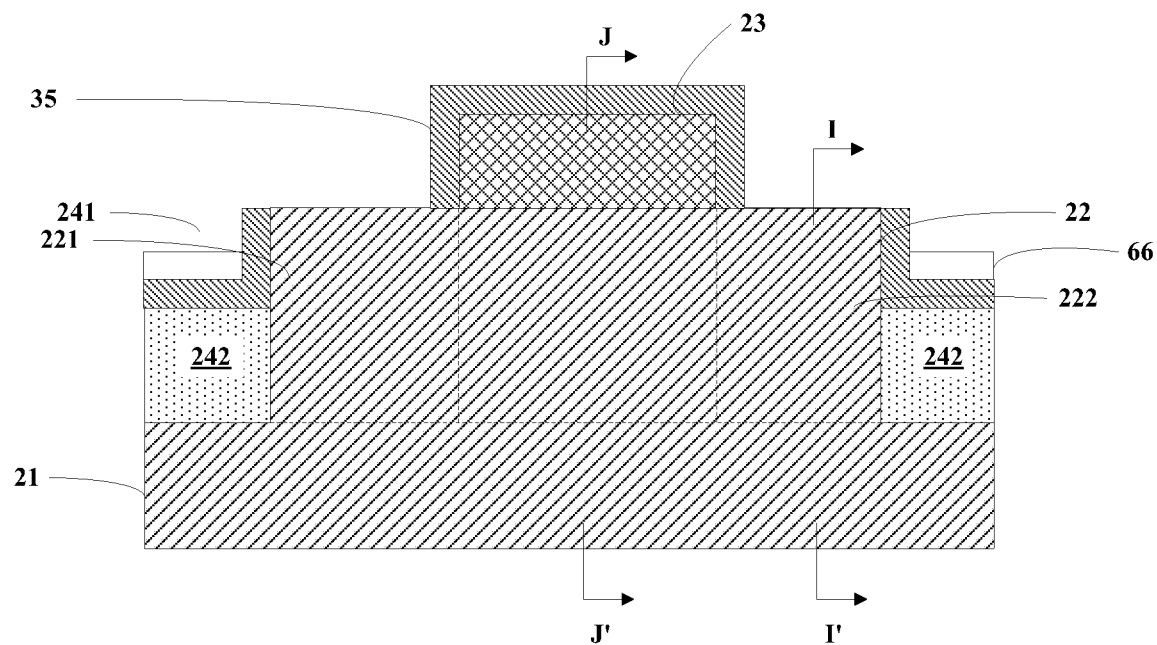
FIG. 7A is a schematic sectional view of a structure at one stage in a process of manufacturing a semiconductor device according to some implementations of the present disclosure.
Figure 7B:
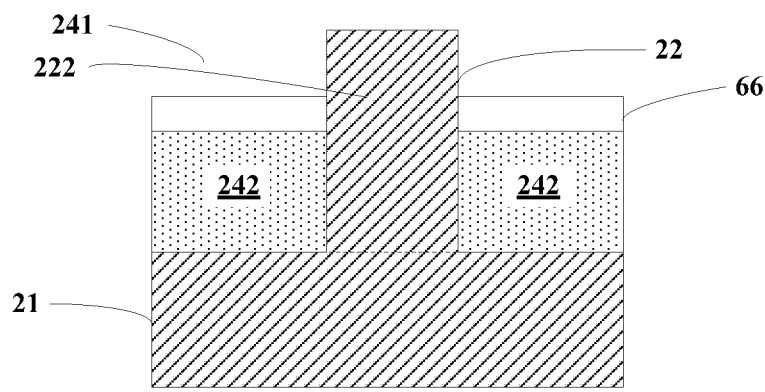
FIG. 7B is a schematic sectional view of a structure captured along a line I-I' in FIG. 7A.
Figure 7C:
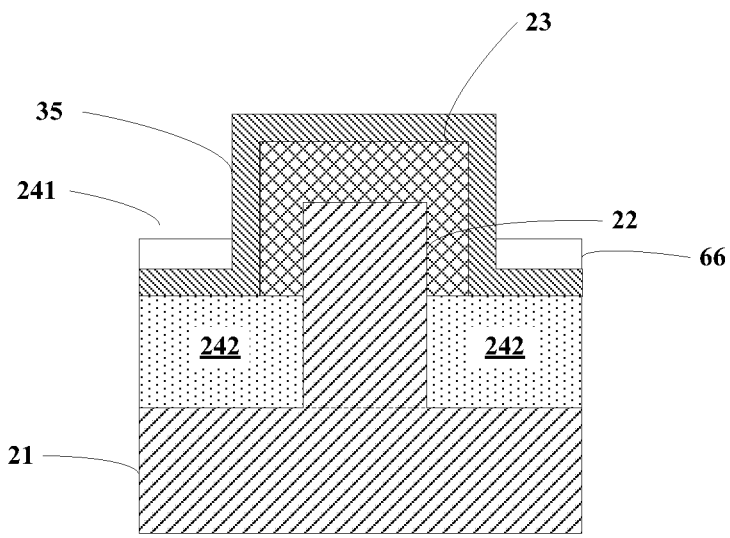
FIG. 7C is a schematic sectional view of a structure captured along a line J-J' in FIG. 7A.

Then, optionally, as shown in FIG. 7A to FIG. 7C, after the planarization is executed, the cover layer 66 is etched to remove a part, separately located on two sides of the first part 221 and two sides of the second part 222, of the cover layer, so as to expose a part of the first part 221 and a part of the second part 222 (as shown in FIG. 7B). The etching may be executed to further remove a part, disposed on the pad layer 35 on the gate structure 23, of the cover layer 66.

A remaining part, located on two sides of the first part 221 and two sides of the second part 222, of the cover layer 66 is higher than the trench insulator layer 242. Here, the step may make the cover layer (which may be used as shallow trench isolation (STI)) located on two sides of the first part and the second part higher than the trench insulator layer located on two sides of the channel region, so that the exposed parts of the first part and the second part are relatively small. Consequently, in a subsequent process of respectively forming the source and the drain on the first part and the second part, volumes of the source and the drain are relatively small, so as to reduce a parasitic capacitor composed of the source and the drain, separately and the gate structure, thereby improving device performance.

It should be noted that to prevent the pad layer from being etched to a largest extent in a process of etching the cover layer, materials of the cover layer and the pad layer may select different materials or select materials having different compactnesses. For example, a material of the cover layer may include silicon oxide, and a material of the pad layer may include silicon nitride. For another example, the material of the cover layer may include silicon oxide, and the material of the pad layer may include silicon oxide having a compactness greater than that of the cover layer.

It also should be noted that the foregoing steps of depositing and etching the cover layer are optional implementations. The method in some implementations of the present disclosure may not include the foregoing steps of depositing and etching the cover layer but include directly performing the subsequent step.

Figure 8:
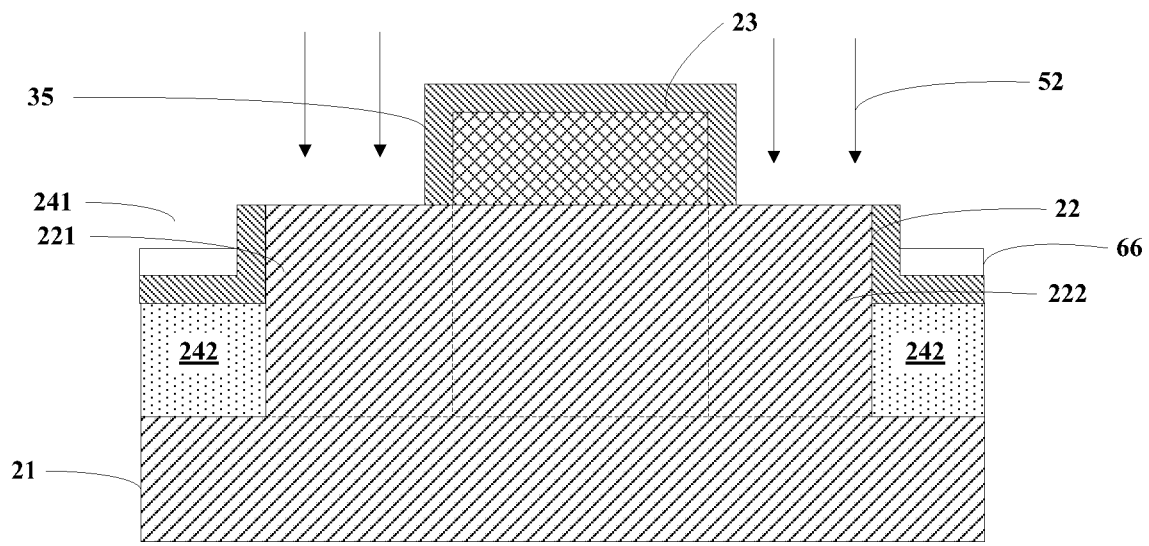
FIG. 8 is a schematic sectional view of a structure at one stage in a process of manufacturing a semiconductor device according to some implementations of the present disclosure.

Then, optionally, as shown in FIG. 8, second doping 52 is executed on the exposed part of the first part 222 and the exposed part of the second part 221, where a dopant from the second doping 52 has a second conductivity type opposite to the first conductivity type. For example, the second doping may be an ion implantation process.

In some implementations, when the first conductivity type is a P type, the second conductivity type is an N type, and the dopant from the second doping may include arsenic, phosphorus, nitrogen, or the like. For example, the ion implantation process may be used as the second doping, so as to implant arsenic, phosphorus, nitrogen, or the like. Process conditions of the ion implantation by means of which these dopants are implanted may include: a range of implantation energy may be from 15 KeV to 40 KeV (for example, the implantation energy may be 20 KeV, 30 KeV, or the like); a range of an implantation dose may be from $3 \times 10^{12}$ cm$^{-2}$ to $3 \times 10^{13}$ cm$^{-2}$ (for example, the implantation dose may be $5 \times 10^{12}$ cm$^{-2}$, $1 \times 10^{13}$ cm$^{-2}$, or the like); a range of an implantation angle may be from 0° to 45° (for example, the implantation angle may be 20°, 30°, 40°, or the like).

In some other implementations, when the first conductivity type is an N type, the second conductivity type is a P type, and the dopant from the second doping may include boron, boron difluoride, indium, or the like. For example, the ion implantation process may be used as the second doping, so as to implant boron, boron difluoride, indium, or the like. Process conditions of the ion implantation by means of which these dopants are implanted may include: a range of implantation energy may be from 5 KeV to 15 KeV (for example, the implantation energy may be 10 KeV); a range of an implantation dose may be from $3 \times 10^{12}$ cm$^{-2}$ to $3 \times 10^{13}$ cm$^{-2}$ (for example, the implantation dose may be $5 \times 10^{12}$ cm$^{-2}$, $1 \times 10^{13}$ cm$^{-2}$, or the like); a range of an implantation angle may be from 0° to 45° (for example, the implantation angle may be 20°, 30°, 40°, or the like).

In some implementations, in a process of executing the second doping, the dopant from the second doping may further include carbon.

In the foregoing process of etching the cover layer, the etching process may also involve etching the exposed part of the first part and the exposed part of the second part, so that the dopants from the first doping in the two parts may decrease. To supplement the dopant, a second doping process herein may be executed. Certainly, the second doping herein may use implantation energy or an implantation dose smaller than that in the first doping or use implantation energy or an implantation dose equal to that in the first doping. The second doping is an optional implementation. The method in some implementations of the present disclosure may not include the second doping but include directly performing subsequent steps.

In some implementations, before or after the second doping is executed, the manufacturing method may further include: executing pocket (PKT for short) doping on the first part 221 and the second part 222, where a conductivity type of a dopant from the pocket doping is the first conductivity type. In some implementations, the conductivity type of the dopant from the pocket doping is the same as the conductivity type of the semiconductor fin and is opposite to conductivity types of the source and the drain to be formed subsequently, so as to prevent the dopants of the source and the drain from laterally diffusing towards the channel region, improve the SCE, and reduce a leakage current, thereby improving device performance.

In some implementations, when the first conductivity type is a P type, the dopant from the pocket doping may include boron, boron difluoride, or the like.

In some other implementations, when the first conductivity type is an N type, the dopant from the pocket doping may include phosphorus, arsenic, or the like. In some implementations, when the dopant includes phosphorus, the dopant from the pocket doping may further include carbon.

In some implementations, the pocket doping may use an in-situ doping process, and a concentration of a dopant from the in-situ doping may be from $1 \times 10^{19}$ cm$^{-3}$ to $5 \times 10^{20}$ cm$^{-3}$. For example, the doping concentration of the in-situ doping may be $5 \times 10^{19}$ cm$^{-3}$, $2 \times 10^{20}$ cm$^{-3}$, or the like.

In some other implementations, the pocket doping may use an ion implantation process. For example, when the dopant is boron, boron difluoride, or the like, ion implantation energy for the pocket doping may range from 500 eV to 5 KeV (for example, 600 eV, 800 eV, or 1 eV). An implantation dose may range from $3 \times 10^{14}$ cm$^{-2}$ to $1 \times 10^{15}$ cm$^{-2}$ (for example, $5 \times 10^{14}$ cm$^{-2}$ or $8 \times 10^{14}$ cm$^{-2}$). For another example, when the dopant is phosphorus, arsenic, or the like, ion implantation energy for the pocket doping may range from 500 eV to 20 KeV (for example, 100 eV, 500 eV, 1 KeV, or 10 KeV). An implantation dose may range from $3 \times 10^{14}$ cm$^{-2}$ to $1 \times 10^{15}$ cm$^{-2}$ (for example, $5 \times 10^{14}$ cm$^{-2}$ or $8 \times 10^{14}$ cm$^{-2}$).

Then, optionally, after the second doping is executed, the manufacturing method may further include: executing annealing processing. For example, the annealing processing may use a laser annealing process. For example, a temperature range of the laser annealing process may be from 1000° C. to 1300° C. (for example, the annealing temperature may be 1100° C. or 1200° C.). An annealing time may be several millseconds (for example, four millseconds or six millseconds). The annealing process may be used for activating the dopant from the first doping or the second doping. In addition, the foregoing pocket doping process may be implemented before the annealing processing.

Figure 9A:
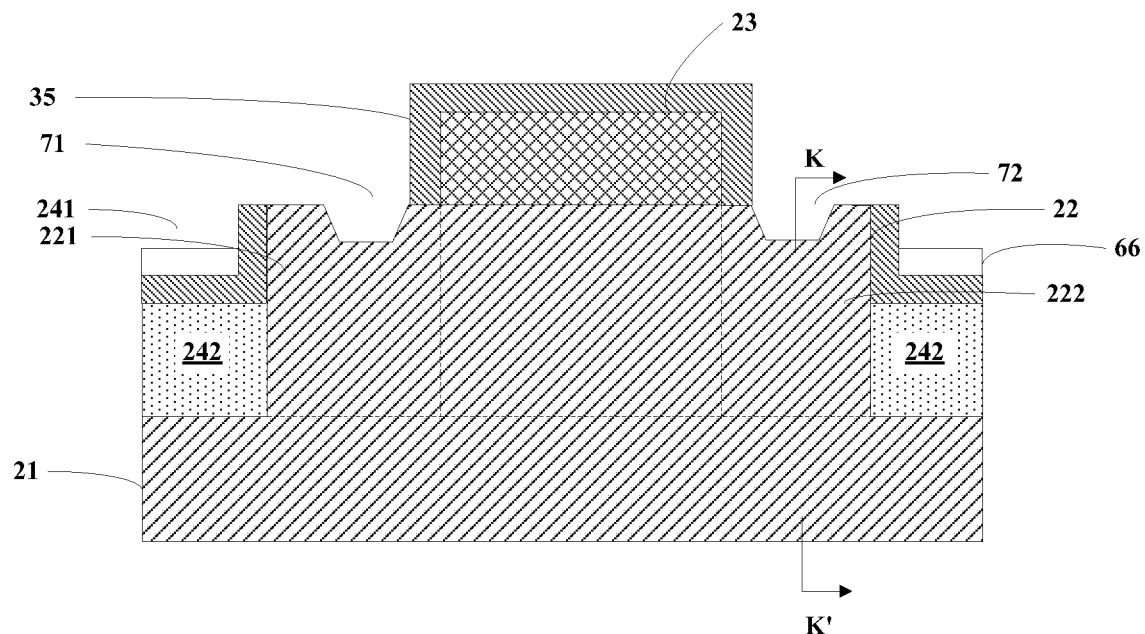
FIG. 9A is a schematic sectional view of a structure at one stage in a process of manufacturing a semiconductor device according to some implementations of the present disclosure.
Figure 9B:
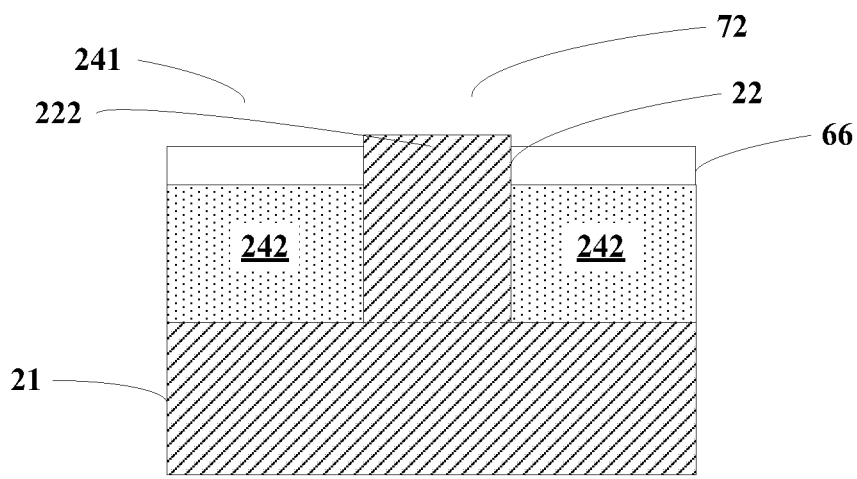
FIG. 9B is a schematic sectional view of a structure captured along a line K-K' in FIG. 9A.

Then, as shown in FIG. 9A and FIG. 9B, the first part 221 and the second part 222 are etched to respectively form a first depression 71 and a second depression 72. Because in the previous steps, the cover layer 66 is formed on two sides of the first part 221 and two sides of the second part 222 (as shown in FIG. 9B), and the cover layer 66 is higher than the trench insulator layer located on two sides of the channel region, so that the exposed parts of the first part and the second part are relatively small. Correspondingly, volumes of the first depression 71 and the second depression 72 formed through etching are also relatively small.

Figure 10A:
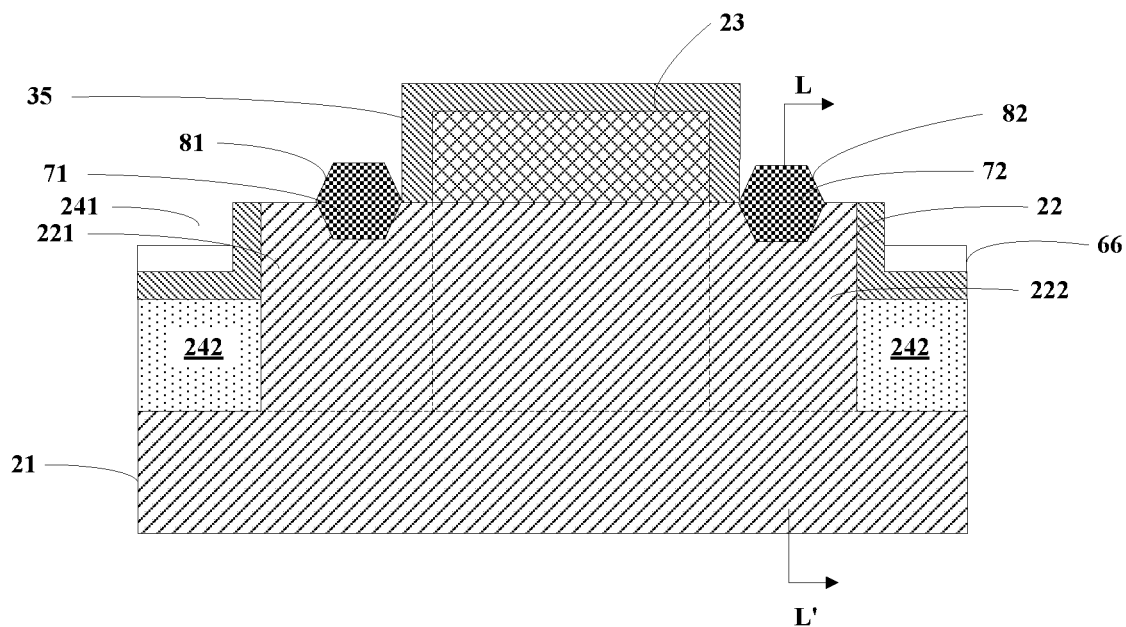
FIG. 10A is a schematic sectional view of a structure at one stage in a process of manufacturing a semiconductor device according to some implementations of the present disclosure.
Figure 10B:
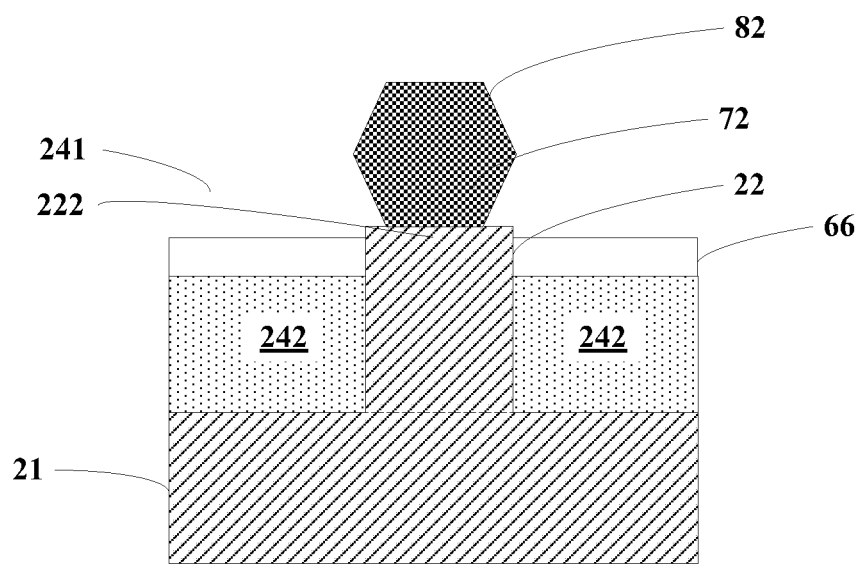
FIG. 10B is a schematic sectional view of a structure captured along a line L-L' in FIG. 10A.

Then, as shown in FIG. 10A and FIG. 10B, a source 81 and a drain 82 are respectively epitaxially grown in the first depression 71 and the second depression 72. Because the first depression and the second depression have relatively small volumes, the source and the drain formed thereby also have relatively small volumes, so as to reduce a parasitic capacitor composed of the source and the drain, separately and the gate structure, thereby improving device performance.

In some implementations, size ranges of epitaxial areas of the source and the drain may be respectively from 20 nm to 70 nm. For example, the epitaxial area may have a size of 40 nm, 50 nm, 60 nm, or the like. The sizes of the epitaxial areas are length or width sizes of the source and the drain in an epitaxial process and reflect the volumes of the source and the drain.

In some implementations, for an NMOS device to be formed, materials of the source and the drain may include silicon or silicon carbide (SiC). For a PMOS device to be formed, the materials of the source and the drain may include silicon germanium (SiGe).

In some implementations, in a process of forming the source and the drain, in-situ doping may be executed on the source and the drain, or after the source and the drain epitaxially formed, then doping (for example, ion implantation) is executed on the source and the drain. For an NMOS device to be formed, the dopants of the source and the drain may be an N-type dopant ((for example, arsenic, phosphorus, or nitrogen). For a PMOS device to be formed, the dopants of the source and the drain may be a P-type dopant (for example, boron, boron difluoride, or indium). It should be noted that the dopants doped with the source and the drain may further include a group III-V ion, carbon, or the like. Therefore, the scope of the present disclosure is not limited thereto.

Above, implementations of a method for manufacturing a semiconductor device are provided. The first doping is executed on the first part and the second part of the semiconductor fin, located on two sides of the gate structure, where the conductivity type of the dopant from the first doping is opposite to the conductivity type of the semiconductor fin, so as to reduce a series resistance between the channel region of the semiconductor fin and the source and the drain, separately. In addition, implementations of the foregoing method can improve the SCE caused by the source and the drain due to epitaxy and can reduce a leakage current, thereby improving device performance.

In some implementations of the method of the present disclosure describe above, the aforementioned manufacturing method may be applied to a process of manufacturing lateral diffused metal oxide semiconductor field effect transistor (MOSFET) device (for example, a p-lateral diffused MOSFET device) or a FinFET logic device.

In some implementations of the manufacturing method of the present disclosure, a semiconductor device is further formed. For example, as shown in FIG. 10 to FIG. 10B, the semiconductor device may include: a substrate 21, a semiconductor fin 22 having a first conductivity type and disposed on the substrate 21, and a gate structure 23 covering a part of the semiconductor fin 22. The semiconductor fin 22 may include a first part 221 and a second part 222 respectively located on two sides of the gate structure 23. The first part 221 and the second part 222 are doped with dopants, and the dopants have a second conductivity type opposite to the first conductivity type. The semiconductor device may further include a source 81 located on the first part 221 and a drain 82 located on the second part 222. The semiconductor device has a relatively low series resistance and therefore, has relatively good performance.

In some implementations, when the first conductivity type is a P type, the second conductivity type is an N type, and the dopants may include arsenic, phosphorus, nitrogen, or the like.

In some other implementations, when the first conductivity type is an N type, the second conductivity type is a P type, and the dopants may include boron, boron difluoride, indium, or the like.

In some implementations, the dopants may further include carbon.

In some implementations, as shown in FIG. 10A, the semiconductor device may further include: a pad layer 35 separately disposed on side surfaces on two sides of the gate structure 23, where the pad layer 35 separately separates the source 81 and the drain 82 from the gate structure 23. The pad layer may also be formed at the top of the gate structure.

In some implementations, as shown in FIG. 10A and FIG. 10B, the semiconductor device may further include: a trench 241 disposed on the substrate 21 and around the semiconductor fin 22; a trench insulator layer 242 partially filling the trench 241; and a cover layer 66 disposed on the trench insulator layer 242 and located on two sides of the first part 221 and two sides of the second part 222.

In some implementations, a material of the cover layer 66 may include silicon oxide; and a material of the pad layer 35 may include silicon nitride or silicon oxide having a compactness greater than that of the cover layer 66.

Figure 11A:
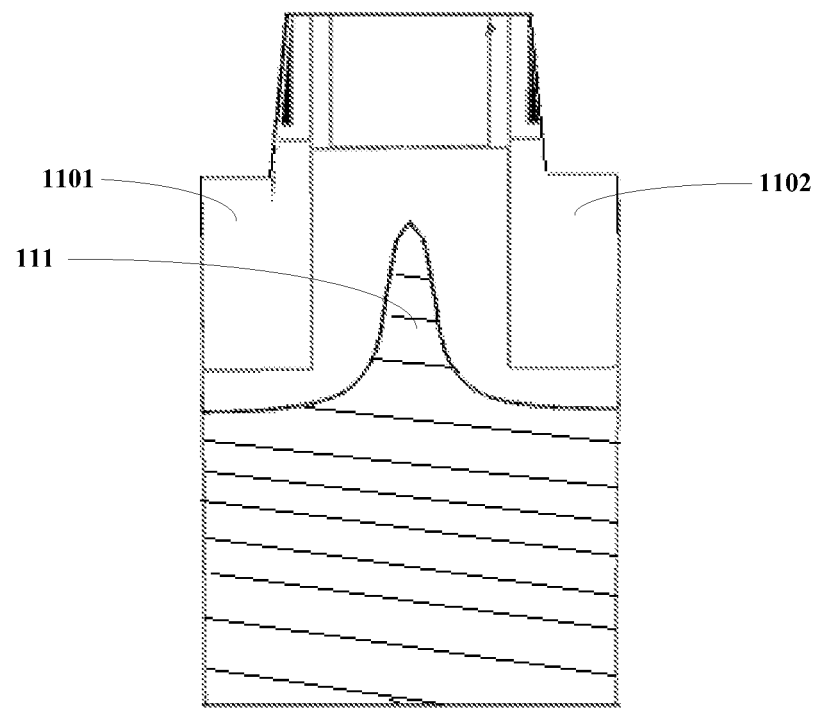
FIG. 11A is a schematic diagram of a test result of a semiconductor device in the prior art.
Figure 11B:
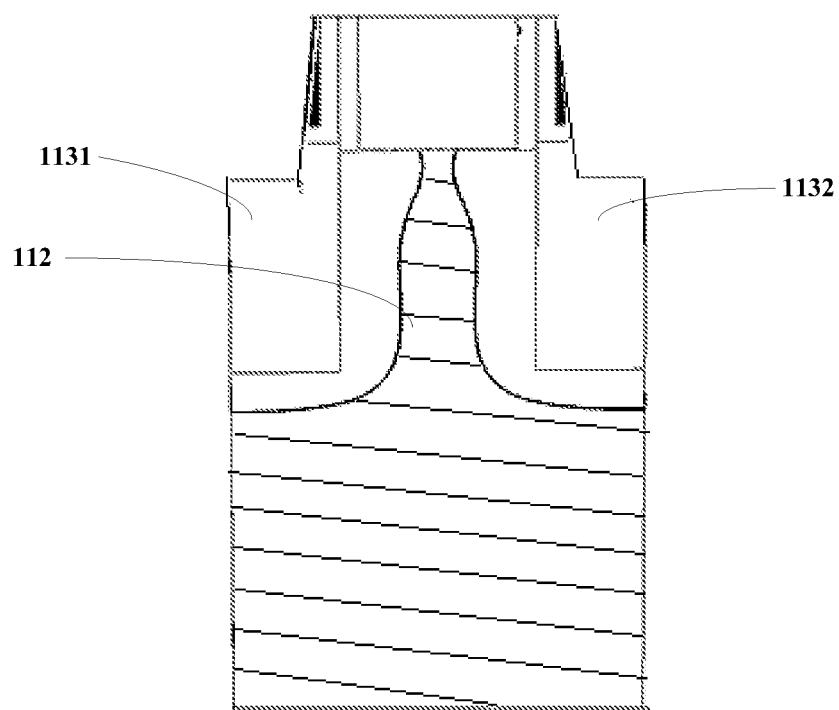
FIG. 11B is a schematic diagram of a test result of a semiconductor device according to some implementations of the present disclosure.

FIG. 11A is a schematic diagram of a test result of a semiconductor device in the prior art. FIG. 11A shows a channel 111 formed by a source doping region 1101 and a drain doping region 1102 of an existing semiconductor device. FIG. 11B is a schematic diagram of a test result of a semiconductor device according to some implementations of the present disclosure. FIG. 11B shows a channel 112 formed by a source doping region 1131 and a drain doping region 1132 of a semiconductor device according to implementations of the present disclosure. It can be seen that compared with the existing device shown in FIG. 11A, the channel 112 of the semiconductor device according to implementations of the present invention shown in FIG. 11B can obviously separate an exhaustion region of the source doping region 1131 and an exhaustion region of the drain doping region 1132 and therefore can obviously improve the SCE.

Above, implementations of methods for manufacturing a semiconductor device and semiconductor devices formed accordingly according to implementations of the present disclosure have been described in detail. To avoiding blocking the concepts of the present disclosure, some details well known in the art are not described. A person skilled in the art will understand, according to the foregoing descriptions, how to implement the technical solutions disclosed herein.

Although some particular implementations of the present disclosure are described in detail using examples, a person skilled in the art will understand that the foregoing examples are merely used for description and are not intended to limit the scope of the present disclosure. A person skilled in the art should understand that the foregoing embodiments and implementations may be amended without departing from the scope and the spirit of the present disclosure. The scope of the present disclosure is defined by the appended claims.

What is claimed is:

1. A method for manufacturing a semiconductor device, comprising:
   providing a semiconductor structure, wherein the semiconductor structure comprises:
   a substrate,
   a semiconductor fin having a first conductivity type and disposed on the substrate, and
   a gate structure covering a part of the semiconductor fin, wherein the semiconductor fin comprises a first part and a second part respectively located on two sides of the gate structure;
   executing first doping on the first part and the second part of the semiconductor fin, wherein a dopant from the first doping has a second conductivity type that is opposite to the first conductivity type and comprises carbon; and
   after the first doping is executed, forming a source on the first part of the semiconductor fin and forming a drain on the second part of the semiconductor fin;
   wherein when the first conductivity type is a P type, the second conductivity type is an N type, and the dopant from the first doping further comprises arsenic, phosphorus, or nitrogen; and
   when the first conductivity type is an N type, the second conductivity type is a P type, and the dopant from the first doping further comprises boron, boron difluoride, or indium.

2. The method according to claim 1, wherein the method further comprises:
   before the first doping is executed:
   depositing a pad layer on the semiconductor structure, wherein the pad layer covers at least the gate structure and the first part and the second part of the semiconductor fin; and
   executing etching on the pad layer to remove a part of the pad layer, located on the first part and the second part of the semiconductor fin, and retain a part of the pad layer, separately located on side surfaces on two sides of the gate structure,
   wherein after the source and the drain are formed, the retained part of the pad layer separately separates the source and the drain from the gate structure.

3. The method according to claim 2, wherein:
   in the step of providing a semiconductor structure, the semiconductor structure further comprises a trench disposed on the substrate and around the semiconductor fin and a trench insulator layer partially filling the trench; and
   the method further comprises, before the source and the drain are formed:
   depositing a cover layer on the semiconductor structure on which the first doping has been executed;
   executing planarization on the cover layer; and
   after the planarization is executed, etching the cover layer to remove a part of the cover layer, separately located on two sides of the first part of the semiconductor fin and two sides of the second part of the semiconductor fin, so as to expose a part of the first part and a part of the second part of the semiconductor fin,
   wherein a retained part of the cover layer, located on two sides of the first part of the semiconductor fin and two sides of the second part of the semiconductor fin, is higher than the trench insulator layer.

4. The method according to claim 3, wherein
   a material of the cover layer comprises silicon oxide; and
   a material of the pad layer comprises silicon nitride or silicon oxide having a compactness greater than that of the cover layer.

5. The method according to claim 4, wherein the method further comprises:
   before the source and the drain are formed, executing second doping on the exposed part of the first part of the semiconductor fin and the exposed part of the second part of the semiconductor fin, wherein a dopant from the second doping has the second conductivity type opposite to the first conductivity type.

6. The method according to claim 5, wherein:
   when the first conductivity type is a P type, the second conductivity type is an N type, and the dopant from the second doping comprises arsenic, phosphorus, or nitrogen; and
   when the first conductivity type is an N type, the second conductivity type is a P type, and the dopant from the second doping comprises boron, boron difluoride, or indium.

7. The method according to claim 6, wherein:
   in a process of executing the second doping, the dopant from the second doping further comprises carbon.

8. The method according to claim 5, wherein:
   the first doping and the second doping are both ion implantation processes.

9. The method according to claim 5, wherein after the second doping is executed and before the source and the drain are formed, the method further comprises: executing annealing processing.

10. The method according to claim 5, wherein the method further comprises:
    before or after the second doping is executed:
    executing pocket doping on the first part and the second part of the semiconductor fin, wherein a conductivity type of a dopant from the pocket doping is the first conductivity type; and
    when the first conductivity type is a P type, the dopant from the pocket doping comprises boron or boron difluoride, and when the first conductivity type is an N type, the dopant from the pocket doping comprises phosphorus or arsenic.

11. The method according to claim 10, wherein:
    the pocket doping uses an in-situ doping process or an ion implantation process.

12. The method according to claim 1, wherein the step of forming a source and a drain comprises:
    etching the first part and the second part of the semiconductor fin to respectively form a first depression and a second depression; and
    respectively epitaxially growing the source and the drain in the first depression and the second depression.

13. A semiconductor device, comprising:
    a substrate;
    a semiconductor fin having a first conductivity type and disposed on the substrate, the semiconductor fin comprising a first part and a second part, wherein the first part and the second part are doped with dopants, the dopants have a second conductivity type opposite to the first conductivity type and comprise carbon;
    a gate structure covering a part of the semiconductor fin, wherein the first part and the second part of the semiconductor fin are respectively located on two sides of the gate structure; and a source disposed on the first part of the semiconductor fin and a drain disposed on the second part of the semiconductor fin;

wherein when the first conductivity type is a P type, the second conductivity type is an N type, and the dopants further comprise arsenic, phosphorus, or nitrogen; and when the first conductivity type is an N type, the second conductivity type is a P type, and the dopants further comprise boron, boron difluoride, or indium.

14. The semiconductor device according to claim 13, further comprising:
a pad layer separately disposed on side surfaces on two sides of the gate structure, wherein the pad layer separately separates the source and the drain from the gate structure.

15. The semiconductor device according to claim 14, further comprising:
a trench disposed on the substrate and around the semiconductor fin;
a trench insulator layer partially filling the trench; and
a cover layer disposed on the trench insulator layer and located on two sides of the first part of the semiconductor fin and two sides of the second part of the semiconductor fin.

16. The semiconductor device according to claim 15, wherein:
a material of the cover layer comprises silicon oxide; and
a material of the pad layer comprises silicon nitride or silicon oxide having a compactness greater than that of the cover layer.

* * * * *